Dec. 12, 1967 G. H. NEWMAN 3,357,264

TUNER ACTUATING MECHANISM

Filed Jan. 24, 1966 2 Sheets-Sheet 1

INVENTOR
GILEAD H. NEWMAN

BY Hill, Sherman, Meroni, Gross & Simpson

ATTORNEYS

Dec. 12, 1967 G. H. NEWMAN 3,357,264

TUNER ACTUATING MECHANISM

Filed Jan. 24, 1966 2 Sheets-Sheet 2

INVENTOR
GILEAD H. NEWMAN

BY Hill, Sherman, Meroni, Gross & Simpson

ATTORNEYS

United States Patent Office 3,357,264

Patented Dec. 12, 1967

3,357,264

TUNER ACTUATING MECHANISM

Gilead H. Newman, Des Plaines, Ill., assignor to TRW Inc., Cleveland, Ohio, a corporation of Ohio Filed Jan. 24, 1966, Ser. No. 522,433
6 Claims. (Cl. 74—10.27)

This invention relates generally to push-button tuners for automobile radios, and more particularly to push-button tuner assemblies wherein each push button is used to select more than one radio station. The invention has particular applicability to FM–AM automobile radios to permit the use of the same set of push buttons for selecting stations within both the FM and AM bands.

An object of the present invention is to provide a push-button tuner which can select a plurality of radio stations and which tuner is compact in size and relatively inexpensive to manufacture.

Another object of the present invention is to provide a push-button tuner wherein the push buttons are used to select a predetermined group of radio stations while the tuner is in one mode of operation, and the push buttons are used to select a different group of radio stations while the tuner is in another mode of operation.

A feature of the present invention is a slidable gate which has a plurality of switching fingers to selectively engage a corresponding number of toggle levers, to selectively place the tuner in one of two modes of operation.

Another feature of the present invention is a toggle lever which is pivotally connected to each of the push-button slides of the tuner. The toggle levers provide efficient means for mechanically connecting each of the push buttons to either one of two actuating devices associated with each of the push buttons.

Briefly, the push-button tuner assembly of the present invention is provided with a plurality of push-button slides. Each of the push-button slides has associated therewith two resettable actuating devices for engaging the tuning mechanism within the tuner. A slidable selector knob is secured to a mechanical gate which, in turn, has a plurality of switching fingers engageable with a corresponding number of toggle levers. Each toggle lever is pivotally connected to a corresponding push-button slide and alternately engageable with a notch in each of the actuating devices associated therewith.

Therefore, when the selector knob is in one position, each of the push buttons is mechanically connected to a particular actuating device to place the radio in condition to be selective of one group of radio stations, for example, on the FM band. However, when the selector knob is in another position, each of the push buttons is mechanically connected to the other one of the actuating devices associated therewith, to place the radio in condition to be selective of a second group of radio stations, for example, on the AM band.

These and other objects and features of the invention will be more fully realized and understood from the following detailed description when taken in conjunction with the accompanying drawings in which like reference numerals throughout the various views of the drawings designate similar elements.

Figure 1:
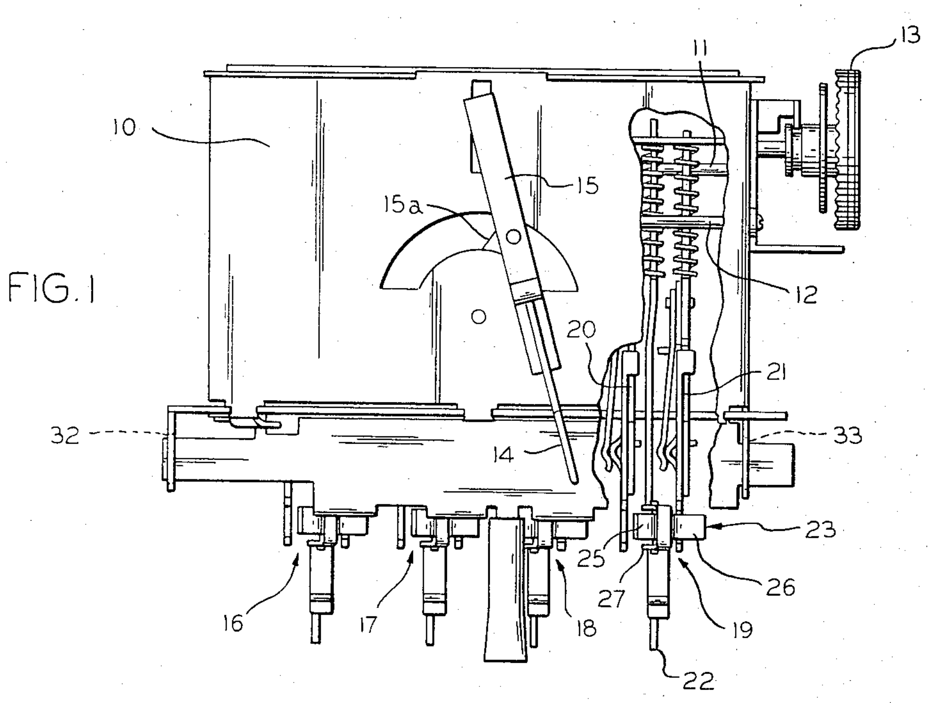
FIGURE 1 is a top plan view of a push-button tuner constructed in accordance with the principles of the present invention and which has a portion broken away to more clearly illustrate the invention.
Figure 2:
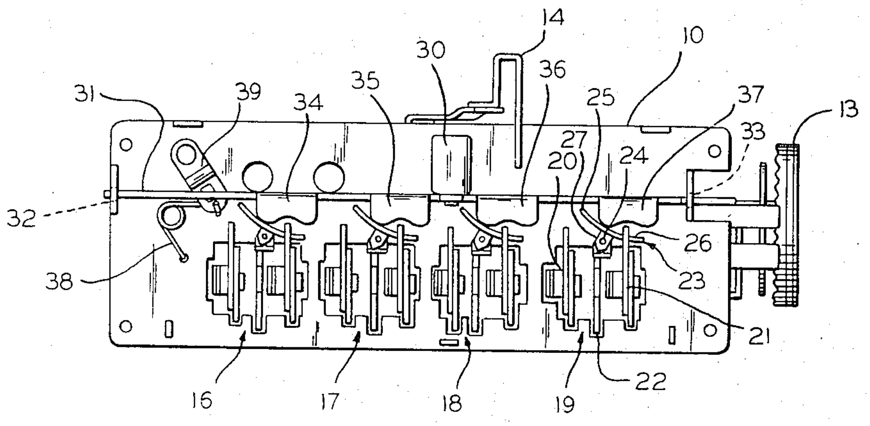
FIGURE 2 is a front elevational view of the push-button tuner of FIGURE 1.

As seen in FIGURES 1 and 2, a tuner housing 10 contains a tuning mechanism which includes a pair of rods 11 and 12. The rods 11 and 12 are coupled together to be incrementally rotatable within the housing 10 about a common axis intermediate the rods and parallel therewith. Furthermore, the rods 11 and 12 are connected to a plurality of tuning slugs within the housing 10 through a series of links and levers (not shown) which constitutes the tuning mechanism. Therefore, when the rods 11 and 12 are rotated about their axes, the tuning slugs within the housing 10 will be moved in an axial direction within their associated coils, thereby causing the tuner to progressively change its reception frequency.

A clutch assembly 13 extends from the tuner housing 10 and is operated in the conventional manner. The clutch assembly 13 disengages a manual tuning knob, not shown, whenever the tuning mechanism is actuated by any of the push-button selector units of the tuner.

A dial indicator 14 is secured to an arm 15 which, in turn, is pivotably mounted to the top of the tuner by a cam 15*a*, as seen in FIGURES 1 and 2. The cam 15*a* is connected to the tuning mechanism within the housing 10 so as to move the dial indicator when the tuning mechanism is moved. The dial indicator 14 provides a visual indication of the position of the tuning slugs within the tuner housing, and this information is interpreted in terms of reception frequency on a dial face of the radio, as is well known in the art.

The housing 10 has a plurality of push-button selector units 16, 17, 18 and 19. Since the selector units 16–19 are substantially the same, only the selector unit 19 will be discussed in detail herein below. Furthermore, although there are four selector units shown, it should be evident that any number of such units could be employed.

The selector unit 19 consists of a pair of actuating devices 20 and 21 which are positioned on opposite sides of a push-button slide 22. A toggle lever 23 is pivotally connected to the push-button slide 22. The toggle lever 23 has a pair of wing-like extended portions 25 and 26, and a stem 27. The stem 27 may consist of a pair of legs extending from the toggle lever 23 from a point intermediate the extended portions 25 and 26, and pivoted about a pin 24 carried by the slide 22.

Figure 3:
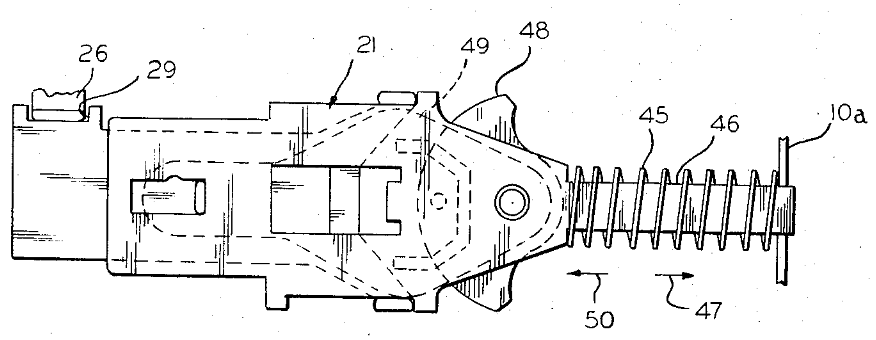
FIGURE 3 shows a detailed construction of one of the actuating devices engaged with one side of the toggle lever.
Figure 4:
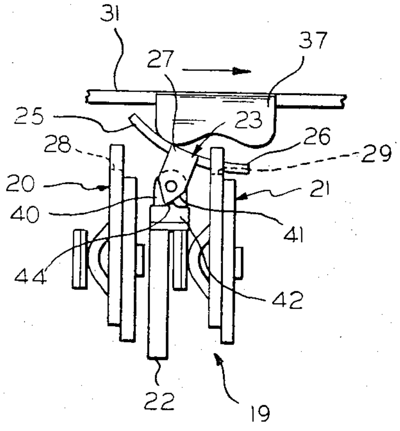
FIGURE 4 shows a detailed construction and operation of the slidable gate and the toggle lever when the gate is moved in one direction.
Figure 5:
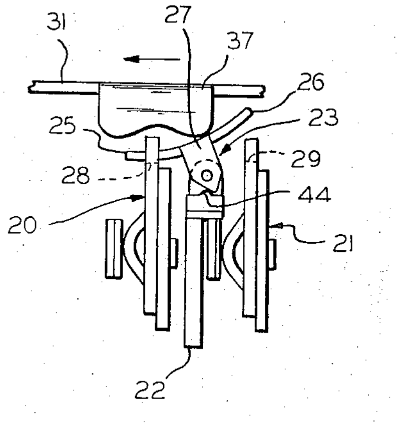
FIGURE 5 shows a detailed construction and operation of the slidable gate and the toggle lever when the gate is moved in the other direction.

As best seen in FIGURES 3, 4 and 5, the actuating devices 20 and 21 are provided with notches 28 and 29 respectively. The extended portions 25 and 26 of the toggle lever 23 are positioned so as to alternately engage the notches 28 and 29. When the toggle lever is positioned as shown in FIGURE 4, the push-button slide 22 is mechanically connected to the actuating device 21 for movement therewith. That is, when the push-button slide is pressed inwardly, to select a different radio station, the actuating device 21 will be moved inwardly with the push-button slide. Also, the actuating device 21 will be pulled outwardly by the slide 22 when it is necessary to set the tuning mechanism within the housing 10 to a different radio station which will be selected thereafter by the actuating device 21.

When the toggle lever 23 is in the position shown in FIGURE 5, the push-button slide 22 is mechanically connected to the actuating device 20. The actuating device will then move inwardly or outwardly, as desired, with the push-button slide 22. Therefore, a single push-button slide can be used to select two discrete radio stations by alternately changing the mechanical connection between the slide 22 and either one of the actuating devices 20 and 21.

A selector knob 30 is connected to a slidable gate 31 for movement thereby. The gate 31 is slidably connected to the housing 10 through a pair of apertures 32 and 33 located on opposite sides of the housing 10. The gate 31 is provided with a plurality of switching fingers 34, 35, 36 and 37 for slidable engagement with corresponding toggle levers such as 23. Movement of the gate 31 in one direction will cause all of the toggle levers to engage the corresponding notch in one group of the actuating devices such as 21, while movement of the gate in the other direction will cause the toggle levers to engage the corresponding notch in the other group of actuating devices such as 20. Therefore, the four push-button slides 22 are mechanically connected to one group of actuating devices during one instance thereby providing push-button selection of a first group of radio stations, and the push-button slides 22 are connected to a second group of actuating devices to provide push-button selection of a second group of radio stations.

To maintain the gate 31 in one of two positions, an over center spring 38 is connected to a pivotably mounted lever 39 which, in turn, is connected to the gate 31. The spring 38 and lever 39 maintain the gate 31 in the extreme right hand or left hand position whichever the case may be.

To maintain the toggle levers 23 precisely in engagement with the notching 28 or 29, the stem 27 has the bottom end thereof sharply tapered to form two angled sides 40 and 41, as best seen in FIGURES 4 and 5. The angled sides 40 and 41 engage a flat leaf spring 42 which, in turn, is secured to the push-button slide 22. Therefore, the resilient action of the spring 42 maintains the toggle lever 23 in either one of the two selected positions and prevents the toggle lever from inadvertently bouncing out of position until the switching finger 37 slidably engages the toggle lever 23. Furthermore, the spring 42 may be provided with a slight protuberance 44 substantially in the center thereof to further facilitate the function of maintaining the toggle lever 23 in either one of the two discrete positions.

As seen in FIGURE 3, a spring 45 is positioned about an extended portion 46 of the actuating device 21. When the push-button slide is pressed inwardly, the actuating device 21 connected thereto, by virtue of the notch 29 and the extended portion 26, will cause the actuating device 21 to move in the direction indicated by the arrow 47. Upon releasing the push button, the spring 45 will urge the actuating device 21 and the push button back to their neutral position.

A cam 48 is locked into position by a locking spring 49 when the actuating device 21 is moved in the direction of the arrow 47. However, when the actuating device 21 is moved in the direction indicated by arrow 50, beyond its neutral position, the locking spring 49 will release the cam 48 thereby allowing the cam 48 to sense the position of the actuating device within the housing 10. When the cam 48 senses the position of the actuating device, the cam acquires a position indicative of the position of the actuating device, and will reset the actuating device to that particular position each time thereafter when the push-button slide 22 is depressed, as is well known in the art.

In summary, the present invention has provided a push-button tuner which is capable of push-button selection of twice as many radio stations as there are push buttons on the tuner. When the gate 31 is moved in one direction, all of the toggle levers engage a correseponding notch within one of the actuating devices thereby mechanically connecting the push-button slide 22 to the corresponding actuating device. On the other hand, when the gate 31 is moved in the other direction, all of the toggle levers engage a notch in the other actuating device associated with each of the push-button slides, thereby mechanically connecting the slides to the other one of the actuating devices.

It will be understood that variations and modifications may be effected without departing from the spirit and scope of the novel concepts of this invention.

What is claimed is:

1. A radio tuner including:

a housing;

a tuning mechanism positioned within said housing;

a plurality of push-button slides positioned within said housing, each of said slides having a portion extended from said housing for receiving a push-button;

a plurality of actuating devices positioned within said housing adjacent each of said slides for selectively engaging said tuning mechanism; and means selectively connecting each of said slides to certain ones of said plurality of actuating devices which are adjacent each of said slides, said means causing a certain group of actuating devices to be selectively engageable with said tuning mechanism for selectively tuning the radio to a certain group of radio stations when said means is in one position, and causing a different group of actuating devices to be selectively engageable with said tuning mechanism for selectively tuning the radio to a different group of radio stations when said means is in another position.

2. The tuner of claim 1 wherein said means includes a lever pivotably mounted to each of said slides and selectively connectable to certain ones of said plurality of actuating devices which are adjacent each of said slides.

3. The tuner of claim 1 wherein said means includes a mechanical gate which when moved in one position causes each of said slides to be connected to certain ones of said plurality of actuating devices and when moved to another position causes each of said slides to be connected to different ones of said plurality of actuating devices.

4. The tuner of claim 1 wherein said plurality of actuating devices includes two actuating devices positioned on opposite sides of each of said slides, said actuating devices having notches therein; and wherein said means includes toggle levers each having a pair of wing-like extended portions, a stem having one end thereof secured to and intermediate said extended portions and the other end thereof being sharply tapered to form two flat surfaces angled toward said extended portions, pivot means for connecting said toggle levers to corresponding ones of said slides at a point intermediate the ends of said stems, a movable mechanical gate mounted on said housing and having a plurality of switching fingers slidably engageable with corresponding ones of said toggle levers to place one of said extended portions of each of said toggle levers in the notch of one of said actuating devices adjacent each of said slides when said gate is in one position, and to place the other of said extended portions of each of said toggle levers in the notch of the other of said actuating devices adjacent each of said slides when the gate is in a different position, thereby selectively alternately mechanically connecting each of said slides to one or the other of said actuating devices adjacent thereto, and a surface on each of said slides resiliently urged against the tapered end of corresponding ones of said stems on said toggle levers to cause each of said toggle levers to remain in engagement with the notch of the corresponding actuating devices adjacent each of said slides.

5. A radio tuner having a tuning mechanism connected through a releasable clutch to a manual dial selector and connectable to a push-button selector including in combination:

a plurality of push-button slides;

first and second actuating devices associated with each of said slides for selectively engaging the tuning mechanism of the tuner; and means for connecting each of said slides alternately to said first and second actuating devices associated therewith, thereby providing push-button selection of a first group of discrete radio stations when each of said slides is connected to corresponding ones of each of said first actuating devices and providing push-button selection of a second group of discrete radio stations when each of said slides is connected to a corresponding one of each of said second actuating devices.

6. The radio tuner of claim 5 wherein said means is connected between each of said push-button slides and said tuning mechanism to obtain push-button selection of twice as many radio stations as there are push buttons.

References Cited

UNITED STATES PATENTS 3,247,728 4/1966 Wolf et al. ---------- 74—10.33

MILTON KAUFMAN, *Primary Examiner.*